United States Patent [19]

Pichlik

[11] Patent Number: 4,999,624
[45] Date of Patent: Mar. 12, 1991

[54] HIGH SPEED HIGH RESOLUTION ANALOG/DIGITAL CONVERTER CIRCUIT

[75] Inventor: Herbert Pichlik, Altdorf Bei Nurnberg, Fed. Rep. of Germany

[73] Assignee: U.S. Philips Corporation, New York, N.Y.

[21] Appl. No.: 366,105

[22] Filed: Jun. 13, 1989

[30] Foreign Application Priority Data

Jun. 14, 1988 [DE] Fed. Rep. of Germany ....... 3820174

[51] Int. Cl.$^5$ .............................................. H03M 1/06
[52] U.S. Cl. .................................... 341/118; 341/156; 341/141
[58] Field of Search ............... 341/141, 118, 162, 163, 341/156

[56] References Cited

U.S. PATENT DOCUMENTS

| | | | |
|---|---|---|---|
| 3,541,315 | 11/1970 | Naydan et al. ...................... | 341/156 |
| 4,280,196 | 7/1981 | Hornak et al. ....................... | 341/118 |
| 4,618,850 | 10/1986 | Lenhoff, Jr. ......................... | 341/118 |
| 4,849,759 | 7/1989 | Hughes ................................ | 341/156 |
| 4,855,745 | 8/1989 | Smither .............................. | 341/118 |

*Primary Examiner*—William M. Shoop, Jr.
*Assistant Examiner*—Marc S. Hoff
*Attorney, Agent, or Firm*—Bernard Franzblau

[57] ABSTRACT

An analog-to-digital conversion circuit is provided with an analog subtractor having a subtract input coupled to the output of a digital-to-analog converter. An analog-to-digital converter is connected to the output of the analog subtractor. The A/D conversion circuit also includes a control device and a device for error correction coupled to the output of the A/D converter. The circuit aims to provide a higher resolution in two conversion steps and with reduced conversion times. The analog subtractor therefore comprises at least two differential amplifiers and one analog multiplexer with the outputs of the differential amplifiers connected to inputs of the analog multiplexer. A control input of the analog multiplexer is coupled to the control device.

14 Claims, 1 Drawing Sheet

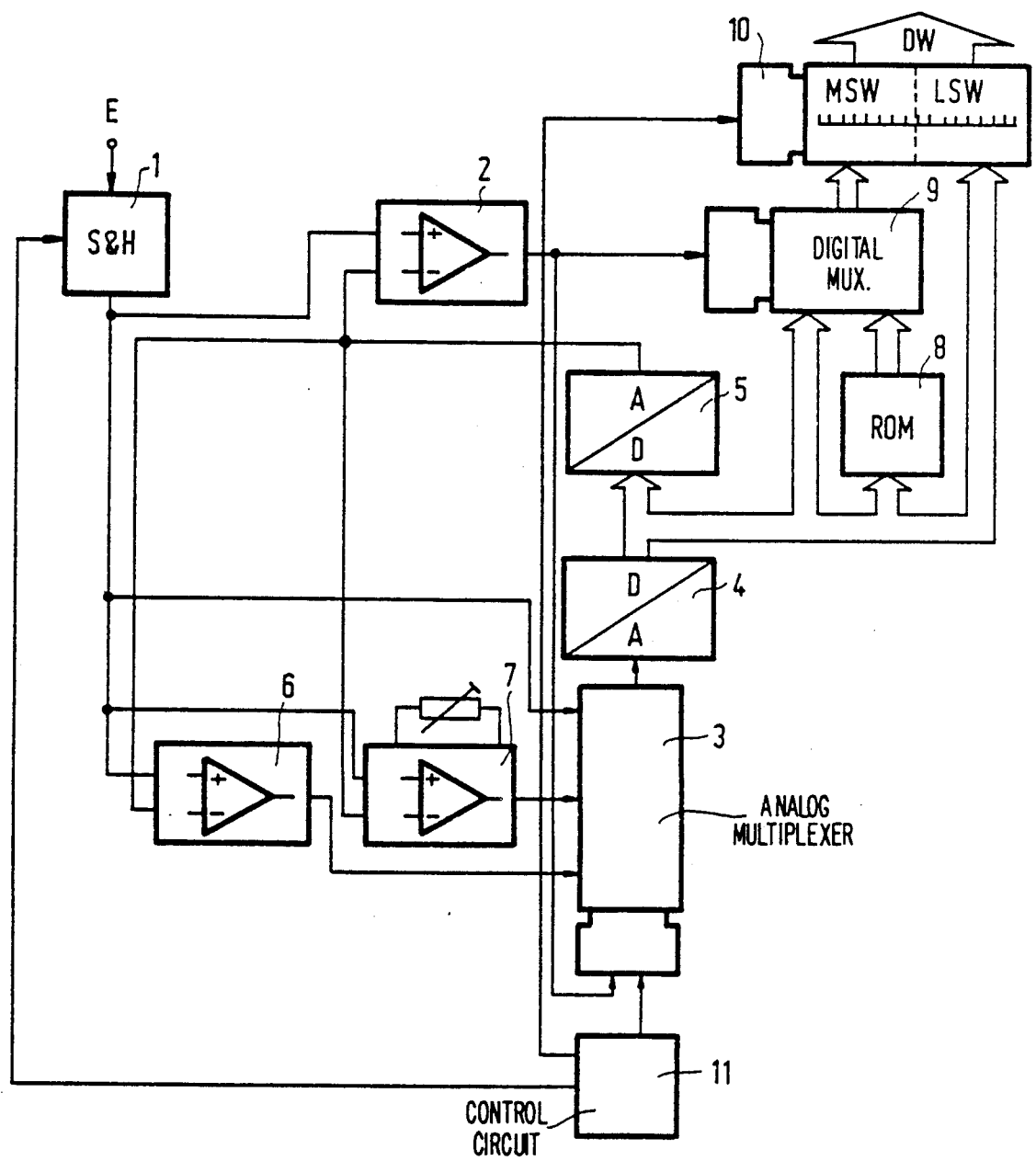

4,999,624

HIGH SPEED HIGH RESOLUTION ANALOG/DIGITAL CONVERTER CIRCUIT

BACKGROUND OF THE INVENTION

This invention relates a circuit arrangement for analog-to-digital conversion comprising an analog subtracter whose subtract input is coupled to the output of a digital-to-analog converter, an analog-to-digital converter connected to the output of the analog subtracter, and a control device and a device for error correction.

A circuit arrangement for analog-to-digital conversion is known, for example, from U.S. Pat. No. 4,618,850. An analog voltage, sampled by means of a sample-and-hold element, is applied to a first input of a subtracter. The output of the subtracter is connected to an analog-to-digital converter having a 4-bit resolution. The four-bit digital output value of the analog-to-digital converter is transferred to a first input of a digital adder. The output value of the adder is buffered in a sum register and is fed out via an output register. The output of the sum register is connected to the input of a digital-to-analog converter having a five-bit resolution. The output of the digital-to-analog converter is connected to a second input of the analog subtracter. The analog subtracter forms a difference voltage between the analog voltages applied to its first input and its second input.

Prior to analog-to-digital conversion a control device resets the sum register to zero. As a result of this, the output value of the digital-to-analog converter is zero so that the voltage applied to the first input of the analog subtracter passes this subtracter without being changed. The analog-to-digital converter quantizes this voltage and generates a corresponding digital value. This value is stored in the sum register and is applied to the digital-to-analog converter. The analog output voltage of the digital-to-analog converter deviates from the analog input voltage as a result of the coarse quantization and possible linearity errors of the analog-to-digital converter in the first conversion step. The analog subtracter forms the difference voltage, which generates a second digital word in a second conversion step. In the adder the first and the second digital words are combined to form a word having a length of five bits. The digital adder and the sum register form a circuit unit for error correction to provide compensation for quantization errors of the analog-to-digital converter. Thus, by means of an n-bit analog-to-digital converter and an n+1 bit digital-to-analog converter an accurate n+1 bit result is obtained in two conversion steps.

SUMMARY OF THE INVENTION

It is an object of the invention to provide a circuit arrangement for analog-to-digital conversion of the type defined in the opening paragraph, which provides a higher resolution in two conversion steps, and to construct the circuit arrangement so as to reduce the conversion time.

This object is achieved in that the analog subtracter comprises at least two differential amplifiers and an analog multiplexer, the outputs of the differential amplifiers being connected to inputs of the analog multiplexer.

Advantageous embodiments are described below and defined in the appended dependent claims.

BRIEF DESCRIPTION OF THE DRAWING

An embodiment of the invention will now be described in more detail, by way of example, with reference to the accompanying drawing.

A voltage applied to an input E of a sample-and-hold element 1 is converted into a digital value DW in two conversion steps. For this purpose a control circuit 11 is connected to a control input of the sample-and-hold element 1. At the beginning of every first conversion step a control pulse transfers the sampled input signal to the output of the sample-and-hold element 1. Regardless of how the input signal subsequently varies as a function of time, this voltage value on the output of the sample-and-hold element, hereinafter referred to as the "sampled voltage", is maintained constant during the two conversion steps.

The sampled voltage is applied to a first input of a comparator 2, to a first input of an analog multiplexer 3, and to first inputs of a first and a second differential amplifier 6 and 7. The outputs of the differential amplifiers 6 and 7 are connected to second and third inputs of the analog multiplexer 3. The output signal of the comparator 2 is applied to a first control input of the analog multiplexer 3 and to a control input of a digital multiplexer 9. The output signal of the analog multiplexer 3 is applied to an analog-to-digital converter 4. The analog-to-digital converter 4 converts the analog signal from the analog multiplexer 3 into a binary value. The analog-to-digital converter used in the present embodiment has an eight-bit resolution. Hereinafter, the maximum input voltage is defined as that voltage which exactly generates the maximal binary value of the analog-to-digital converter. Moreover, hereinafter the resolution voltage is to be understood to mean any voltage difference for which the output binary value of the analog-to-digital converter 4 changes by exactly one LSB (least significant bit).

The binary value is applied to a digital-to-analog converter 5, to a read-only memory 8 and to the digital multiplexer 9.

A further output of the control circuit 11 is applied to a second control input of the analog multiplexer 3. Regardless of the state of the control signal from the comparator 2, the control signal from the control circuit 11 controls the analog multiplexer 3 in such way that in the first conversion step the sampled voltage is always applied to the input of the analog-to-digital converter 4. The binary value supplied by the analog-to-digital converter 4 in this first conversion step is referred to hereinafter as the "most-significant value". The digital-to-analog converter 5 re-converts the most-significant value of the sampled signal into an analog voltage, which is referred to hereinafter as the "re-converted voltage".

When the binary input value of the digital-to-analog converter 5 changes by the binary value one, the output voltage of the digital-to-analog converter 5 will change by a specific analog voltage value. In the present embodiment the digital-to-analog converter 5 has been selected in such a way that this value corresponds exactly to the resolution voltage of the analog-to-digital converter 4. Thus, the re-converted voltage substantially corresponds to the sampled voltage after the first conversion step. The voltage difference between these two voltages is referred to hereinafter as the "quantization error". This quantization error results from the fact that the resolution of the analog-to-digital converter 4 is limited to eight bits. Consequently, the quantization error is situated in a voltage range between half the negative resolution voltage and half the positive resolution voltage of the analog-to-digital converter 4. However, the quantization error may be larger as a result of non-linearities of the two converters.

The re-converted voltage is applied to second inputs of the differential amplifiers 6 and 7. The differential amplifiers form the difference between the sampled value applied to their first inputs and the reconverted voltage applied to their second inputs, so that a voltage proportional to the quantization error appears on their outputs. In the present embodiment the gain factor of the differential amplifiers 6 and 7 is 256. This gain factor corresponds to two to the eighth power, i.e. the number of bit combinations into which the analog-to-digital converter 4 can resolve an input voltage. This gain factor of 256 guarantees that the absolute maximum quantization error may assume the value of the resolution voltage without the amplified quantization error exceeding the maximum input voltage of the analog-to-digital converter 4.

The second differential amplifier 7 is provided with a circuit which ensures that a constant offset voltage is obtained. The offset voltage obtained at the differential amplifier corresponds accurately to the resolution voltage of the analog-to-digital converter 4 and is given such a polarity that the output voltage of the second differential amplifier 7 is increased by one two-hundred-and-fifty-sixth of this voltage value. Thus, a positive output voltage is produced on the output of the second differential amplifier 7 in the case of negative quantization errors.

If the sampled voltage is slightly larger than the re-converted voltage, the quantization error will be positive and the comparator 2, whose second input receives the re-converted voltage, will generate a positive output signal. However, if the re-converted voltage is smaller than the sampled voltage, the quantization error and hence the output voltage of the first differential amplifier 6 will be negative and the comparator 2 will generate a negative output signal By means of a control signal from, the control circuit 11 always connects one of the two differential amplifiers 6 and 7 to the analog-to-digital converter 4 via the analog multiplexer 3 in the second conversion step. By means of the output signal of the comparator 2 a selection is made between the output signals of these two differential amplifiers so as to transfer that output signal which is situated in a range between zero volts and the maximum input voltage of the analog-to-digital converter 4.

In this way both the multiplied quantization error of the first differential amplifier 6 and the multiplied and sign-corrected quantization error of the second differential amplifier 7 are generated simultaneously. The choice between these two voltages is made via the analog multiplexer 3. In contradistinction to circuit concepts in which the binary value of the quantization error or a correspondingly corrected binary value is computed, after which it is converted from a digital value into an analog voltage, this computation time is not required by the present concept. The switching times of the comparator 2 and the analog multiplexer 3 are comparatively small relative to this computation time, as a result of which the time interval required between output of the first binary value and the start of the second conversion step on account of the transient times of the various circuit elements can be substantially halved. This results in a considerable reduction of the conversion time.

In the second conversion step the amplified quantization error is converted into a second binary value. This second binary value is referred to hereinafter as the "least-significant value".

The most-significant value MSW and the least-significant value LSW are combined to form a sixteen-bit digital value DW. If the quantization error is positive the most-significant value and the least-significant value can be combined simply. However, if the quantization error is negative the most-significant value should first be decremented by one bit. In order to preclude additional delays as a result of this subtraction the corrected most-significant value is formed by means of a read-only memory 8. For this purpose the binary value of the first conversion step is applied to address inputs of the read-only memory 8. The storage locations, which can thus be addressed, each store the address minus the value one. Only the value stored at address zero has the value zero. By means of the output signal of the comparator 2 the digital multiplexer 9 selects either the binary value of the first conversion step or the output value of the read-only memory 8. This has the advantage that immediately after it has been ascertained whether the most-significant value is to be corrected, both values are already available at the input of the digital multiplexer 9. Since the switching time of the digital multiplexer 9 is small relative to the computation time for the correction value, this also leads to a substantial saving in time.

In the embodiment described above maximum quantization errors up to the resolution of the analog-to-digital converter can be allowed. If converters are used whose maximum quantization errors can become equal to twice the resolution voltage, a third and a fourth differential amplifier and three further comparators must be provided. The gain factors of these differential amplifiers should then be equal to those of the other differential amplifiers. The offset voltage of the third differential amplifier should then be such that the output voltage of the third differential amplifier is raised by two hundred and fifty-six times the resolution voltage and the offset voltage of the fourth differential amplifier should be such that the output voltage of this differential amplifier is raised by one hundred and twenty-eight, corresponding to two to the seventh power, times the resolution voltage. Moreover, the digital multiplexer should be extended by two further inputs to which two further read-only memories should be connected to provide an incrementation by the value one and a decrementation by the value two, respectively. The switching voltages of the comparators are then spaced apart by one resolution voltage and control the analog multiplexer as well as the digital multiplexer.

What is claimed is:

1. A circuit arrangement for analog/digital conversion comprising:
   an analog input for receiving an analog signal,
   an analog subtractor comprising first and second differential amplifiers and an analog multiplexer, means for coupling first inputs of the first and second differential amplifiers and the analog multiplexer to said analog input and for coupling outputs of said first and second differential amplifiers to respective second and third inputs of the analog multiplexer, an analog/digital converter coupled to an output of the analog multiplexer, a digital/analog converter having an input coupled to an output of the analog/digital converter and an output coupled to second inputs of the first and second differential amplifiers, a control device having an output coupled to a control input of the analog multiplexer, and a device for error correction coupled to the output of the analog/digital converter.

2. A circuit arrangement as claimed in claim 15 wherein at least one of the differential amplifiers comprise a correction circuit for adding a predetermined offset voltage to the output voltage of the one differential amplifier.

3. A circuit arrangement as claimed in claim 2, wherein the offset voltage is selected such that the output voltages of the differential amplifiers differ by an integral multiple of the resolution voltage of the digital-to-analog converter.

4. A circuit arrangement as claimed in claim 3 further comprising second means for coupling the output of the analog-to-digital converter to a first input of a digital multiplexer and to a second input of the digital multiplexer via the device for error correction.

5. A circuit arrangement as claimed in claim 4 further comprising a sample-and-hold device having an input coupled to said analog input and an output coupled to said first inputs of the first and second differential amplifiers and the analog multiplexer via the first coupling means, a comparator having first and second inputs coupled to said output of the sample-and-hold device and to the output of the digital/analog converter, respectively, and third means for coupling an output of the comparator to a control input of the digital multiplexer.

6. A circuit arrangement as claimed in claim 2, further comprising second means for coupling the output of the analog-to-digital converter to a first input of a digital multiplexer and to a second input of the digital multiplexer via the device for error correction.

7. A circuit arrangement as claimed in claim 6 further comprising a sample-and-hold device having an input coupled to said analog input and an output coupled to said first inputs of the first and second differential amplifiers and the analog multiplexer via the first coupling means, a comparator having first and second inputs coupled to said output of the sample-and-hold device and to the output of the digital/analog converter, respectively, and third means for coupling an output of the comparator to a control input of the digital multiplexer.

8. A circuit arrangement as claimed in claim 1 further comprising second means for coupling the output of the analog-to-digital converter to a first input of a digital multiplexer and to a second input of the digital multiplexer via the device for error correction.

9. A circuit arrangement as claimed in claim 8 further comprising a sample-and-hold device having an input coupled to said analog input and an output coupled to said first inputs of the first and second differential amplifiers and the analog multiplexer via the first coupling means, a comparator having first and second inputs coupled to said output of the sample-and-hold device and to the output of the digital/analog converter, respectively, and third means for coupling an output of the comparator to a control input of the digital multiplexer.

10. A circuit arrangement as claimed in claim 1 further comprising a sample-and-hold device having an input coupled to said analog input and an output coupled to said first inputs of the first and second differential amplifiers and the analog multiplexer via the first coupling means, a comparator having first and second inputs coupled to said output of the sample-and-hold device and to the output of the digital/analog converter, respectively, a digital selection device having a first input coupled to the output of the analog/digital converter and a second input coupled to the output of the analog/digital converter via the error correction device, and third means for coupling an output of the comparator to a control input of the digital selection device.

11. A circuit arrangement as claimed in claim 1 wherein at least one of said differential amplifiers includes means for modifying its output voltage by a given offset voltage related to the resolution voltage of the digital/analog converter.

12. A circuit arrangement as claimed in claim 1 further comprising:

a digital selection device having a first input coupled to the output of the analog/digital converter and a second input coupled to the output of the analog/digital converter via the error correction device, means for comparing a signal voltage from said analog input with an output voltage of said digital/analog converter, and means for coupling an output of said comparing means to a control input of the analog multiplexer and to a control input of the digital selection device.

13. A circuit arrangement as claimed in claim 12 wherein the error correction device comprises a read-only memory which stores corrected data related to at least a part of a digital signal supplied by the output of the analog/digital converter.

14. A circuit arrangement as claimed in claim 9 further comprising means for connecting an output of the control device to a control input of the sample-and-hold device.

* * * * *

UNITED STATES PATENT AND TRADEMARK OFFICE
CERTIFICATE OF CORRECTION

PATENT NO. : 4,999,624
DATED : March 12, 1991
INVENTOR(S) : Herbert Pichlik

It is certified that error appears in the above-indentified patent and that said Letters Patent is hereby corrected as shown below:

IN THE CLAIMS

Col. 5, claim 2, line 12, change "15" to --1--

Signed and Sealed this

Seventh Day of December, 1993

Attest:

BRUCE LEHMAN

Attesting Officer     Commissioner of Patents and Trademarks